US006408401B1

(12) United States Patent
Bhavsar et al.

(10) Patent No.: US 6,408,401 B1
(45) Date of Patent: Jun. 18, 2002

(54) EMBEDDED RAM WITH SELF-TEST AND SELF-REPAIR WITH SPARE ROWS AND COLUMNS

(75) Inventors: Dilip K. Bhavsar, Shrewsbury; Donald A. Priore, Maynard, both of MA (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/191,679

(22) Filed: Nov. 13, 1998

(51) Int. Cl.[7] .......................... H02H 3/05; G11C 29/00
(52) U.S. Cl. ................... 714/7; 714/6; 714/8; 714/710; 714/711; 714/723
(58) Field of Search .......................... 714/8, 7, 6, 11, 714/42, 718, 719, 710, 711, 723; 365/200, 185.09, 201

(56) References Cited

U.S. PATENT DOCUMENTS

| | | | | |
|---|---|---|---|---|
| 4,051,354 A | * | 9/1977 | Choate | 714/711 |
| 4,648,075 A | * | 3/1987 | Segawa et al. | 365/200 |
| 5,058,070 A | * | 10/1991 | Faber et al. | 365/200 |
| 5,379,258 A | * | 1/1995 | Murakami et al. | 365/200 |
| 5,644,699 A | * | 7/1997 | Yoshida | 714/7 |
| 5,764,878 A | * | 6/1998 | Kablanian et al. | 714/7 |
| 5,781,717 A | | 7/1998 | Wu et al. | 395/182.06 |
| 6,141,768 A | * | 10/2000 | Lin et al. | 714/8 |

OTHER PUBLICATIONS

Koike, H., et al., "A 30ns 64MbDRAM with Built–in Selft–Test and Repair Function," in 1992 IEEE International Solid–State Circuits Conference, pp. 150–151 with attached IEEE/ISSCC Slide Supplements.

Chen, T. and Sunada, G., "Design of a Self–Testing and Self–Repairing Structure for Highly Hierarchical Ultra–Large Capacity Memory Chips," in IEEE Transactions on Very Large Scale Integration (VLSI) Systems, vol. 1, No. 2, pp. 88–97, Jun. 1993.

Treuer, R. and Agarwal, V.K., "Built–in Self–Diagnosis for Repairable Embedded RAMs," in IEEE Design & Test of Computers, pp. 24–33, 1993.

(List continued on next page.)

Primary Examiner—Peter Wong
Assistant Examiner—Tim Vo
(74) Attorney, Agent, or Firm—Hamilton, Brook, Smith & Reynolds, P.C.

(57) ABSTRACT

A self-repair method for a random access memory (RAM) array comprises writing a value to the memory array, reading a value from the memory array and comparing the read and write values to identify faulty memory cells in the memory array. An address of a newly-discovered faulty memory cell is compared to at least one address of at least one previously-discovered faulty memory cell. The address of the newly discovered faulty memory cell is stored if a column or row address of the newly-discovered faulty cell does not match any column or row address, respectively, of a previously-discovered faulty memory cell. Flags are set to indicate that a spare row or a spare column must replace the row or column, respectively, identified by the address of the previously-discovered faulty memory cell, if the row or column address of the newly-discovered memory cell matches the respective row or column address of the previously-discovered faulty memory cell. Spare rows and columns that have been indicated by the flags as requiring replacement are allocated to replace faulty rows and columns respectively. The remaining spare rows and columns whose row and column addresses respectively have been stored are then allocated. Furthermore, the RAM is flagged as unrepairable if an insufficient number of spare rows or spare cells remain to replace all of the rows or columns containing faulty cells.

29 Claims, 6 Drawing Sheets

OTHER PUBLICATIONS

Bhavsar, D. and Edmondson, J.H., "Testability Strategy of the Alpha AXP 21164 Microprocessor," 10 pages, Preprint: International Test Conference, Washington, D.C., Oct. 1994.

Bhavsar, D.K. et al., "Testability Access of the High Speed Test Features in the Alpha 21264 Microprocessor," 9 pages, International Test Conference, Washington, D.C., Oct. 1998.

* cited by examiner

EMBEDDED RAM WITH SELF-TEST AND SELF-REPAIR WITH SPARE ROWS AND COLUMNS

BACKGROUND OF THE INVENTION

Modern microprocessors employ large on-chip random access memories (RAMs) in a variety of ways to enhance performance. These RAMs are typically static (SRAMs) due to associated speed advantages. The most common usage is in the form of on-chip caches. In many instances, such RAMs constitute the majority of transistors consumed on chip and are the largest occupants of chip area.

Embedded RAMs give rise to two particular problems during chip manufacturing. Because an embedded RAM occupies a significant portion of a chip's area, the probability that a defect lies within the RAM is relatively high. The RAM thus becomes a controlling factor in chip yield. Second, the embedding of RAM not only makes its own testing difficult, but also impairs testability of all other functions on chip, such as the core logic. For example, much of the testing of other functions requires the use of the embedded RAM, which must be functioning properly.

Traditionally, semiconductor manufacturers have tackled RAM yield problems by incorporating a repair scheme with redundant rows and/or columns. For embedded RAM, however, this compounds the testing problems because a diagnosis to identify defects and the repair of those defects are required before the testing of core logic, for example, can begin.

Recently, Built-in Self -Test (BiST) and Built-in Self-Repair (BiSR) have been proposed as potential solutions to both of the above problems. The scheme presented by Koike et al, "A 30 ns 64 Mb DRAM with Built-in Self-Test and Repair Function", *Int'l Solid State Circuits Conf.*, pp 150–151, February 1992, self-repairs only field failures. It employs traditional row-column repair to remove manufacturing defects. In the traditional method, a specialized RAM tester tests integrated circuit RAMs, and gathers and analyzes failure information, while the repair is done by blowing fuses. Koike's on-chip scheme employs an on-chip microprogram read-only-memory (ROM) BiST scheme and self-repair logic block with a spare memory block.

The scheme presented by Chen and Sunada, "Design of a Self-testing and Self-repairing Structure for Highly Hierarchical Ultra Large Capacity Memory Chips," *IEEE Trans. On VLSI Systems*, pp. 88–97, Vol. 1, No. 2, June 1993, employs an on-chip RISC processor to collect and analyze a full failure bitmap to derive a repair solution. Besides the complexities of the RISC processor, the method also requires that a large enough block of the RAM under test must be available and fault-free to store a failure bitmap.

The BiST/BiSR schemes presented by Trueuer and Agarwal, "Built-in Self-Diagnosis for Repairable Embedded RAMs," *IEEE Design and Test of Computers*, pp. 24–33, June 1993, and Bhavsar and Edmondson, "Testability Strategy of the Alpha AXP 21164 Microprocessor," *Int'l Test Conference*, October 1994, are limited to self-repair with only spare rows.

SUMMARY OF THE INVENTION

The problem with the previous approaches here has been high complexity, e.g., the RISC processor of Chen and Sunada, or limited repair capability, e.g., using only spare rows or only spare columns. The present invention concerns a method for the self-repair of a RAM with both a spare row and a spare column using a significantly simpler built-in self-test/built-in self-repair (BiST/BiSR) logic. The scheme affords a greater flexibility in spare resource allocation and therefore can result in higher yield while utilizing simplified self-test/self-repair logic.

In accordance with a preferred embodiment of the present invention, a self-repair method for a random access memory (RAM) array comprises:

writing a value to the memory array;

reading a value from the memory array and comparing the read and write values to identify faulty memory cells in the memory array;

comparing an address of a newly-discovered faulty memory cell to at least one address of at least one previously-discovered faulty memory cell;

storing the address of the newly discovered faulty memory cell, if a column or row address of the newly-discovered faulty cell does not match any column or row address, respectively, of a previously-discovered faulty memory cell; and setting flags to indicate that a spare row or a spare column must replace the row or column, respectively, identified by the address of the previously-discovered faulty memory cell, based on a present state of the flags and whether the row and/or column address of the newly-discovered memory cell matches the respective row and/or column address of one or more previously-discovered faulty memory cells.

The present state of the flags includes the present state of row and column "must" flags, and entry valid flags.

Preferably, spare rows and column slices are allocated to replace faulty rows and columns respectively as indicated by the flags. Any remaining spare rows and columns, the addresses of which have been stored, are then allocated. Furthermore, the RAM is flagged as unrepairable if an insufficient number of spare rows or columns remain to replace all of the rows or columns containing faulty cells.

The preferred embodiment comprises a plurality of memory blocks, each block comprising a plurality of memory cells organized into rows and N-bit wide column slices, where N is 1 or greater. Each slice represents one bit of the addressed word. A portion of the address is used to select a row. Another portion is used to select a particular column within each column slice. A spare row and column slice are available to replace a row or column slice having a faulty cell. In storing spare column slice allocation information, it is preferable to use a unique column slice address, or identifier, to identify the replaced column slice. Note that, while in the preferred embodiment a spare column slice, rather than an individual spare column, is available to replace an entire column slice having a faulty cell, the concept is the same as for individual column replacement, and the present invention applies equally well to such a system. In this case, the terms column slice address and column address are synonymous. In general, however, we use column, or column slice address (or identifier) to identify the group (individual, complete slice, or otherwise) of columns being replaced.

A test and repair logic circuit locates faulty cells within the memory array. A failure bitmap has at least two entries, where each entry comprises a row address field and a column address field for storing the row and column slice address of a faulty cell detected by the test and repair logic circuit. In addition, each entry comprises a flag for indicating that the row indicated in the row address field must be replaced with a spare row. Similarly, each entry comprises a flag for indicating that the column indicated in the column address field must be replaced with a spare column. In a 2-entry failure bitmap, this signifies that at least two faulty cells are present in the indicated row or column. A spare allocation logic circuit uses the failure bitmap's contents to decide how to allocate the spare rows and spare columns.

A segment allocation map comprising row-column repair registers and logic is maintained in which spare row and column allocation information generated after the self-test by the failure bitmap and spare allocation logic is stored. Alternately, if allocation information has previously been programmed into an array of fuse links during manufacture, the allocation information is read from the fuse array, and the segment allocation map configured accordingly.

Finally, the preferred embodiment, further comprises a column identifier encoder for encoding column identifiers of columns having faulty cells. A storage means is provided for storing encoded column identifiers and row identifiers. Such storage means includes, but is not limited to, a fuse array, a failure bitmap, or off-chip storage, such as may exist within a test system. Such storage means is also intended to encompass identifiers that are not physically stored but are determined, possibly on the fly, by the test system and down-loaded to the chip.

The repair engine of the preferred embodiment comprises a decoder for decoding an encoded identifier. The decoder itself comprises a counter which cycles through at least all of the allowed encoded identifier values. A comparator compares the counter's value with a stored encoded identifier. The comparator's output indicates whether there is a match. A validity check circuit determines whether the counter's value is a valid encoded identifier, and provides an indication of the validity. When an encoded identifier is valid, the comparator output is sent to the spare allocation logic circuit, preferably by shifting it out over a serial line.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
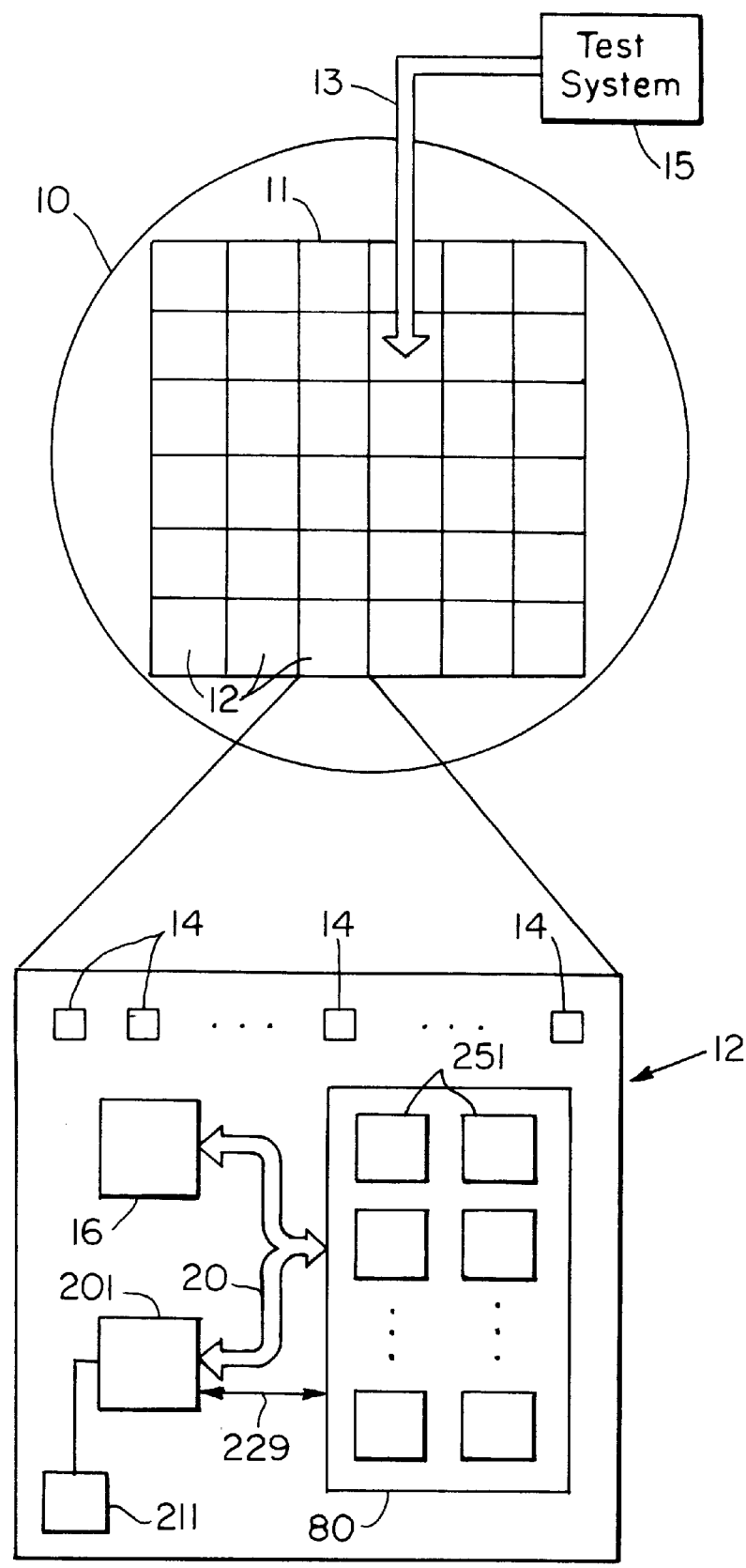
FIG. 1 is a block diagram illustrating a sample silicon wafer with multiple chips, each chip having a RAM with multiple arrays.

FIG. 1 illustrates a typical silicon wafer 10 during fabrication and before being cut up into individual integrated circuit chips. An array 11 of chips 12 is created through a sequence of semiconductor processing steps. The bottom half of FIG. 1 illustrates how different areas of a single chip 12 are devoted to certain functions. For example, in the preferred embodiment, each chip 12 comprises some core logic 16, which may contain, for example, arithmetic or floating point logic units and registers. In addition, each chip comprises an on-chip RAM cache 80. The RAM 80 is physically arranged into an array of identical memory segments 251. The core logic 16 accesses the RAM 80 via a memory bus 20 which carries address, data and control signals.

According to the invention, each RAM segment 251 is independently repairable. Logic 201 for performing a self-test and self-repair algorithm also resides on the chip 12, and communicates with the RAM 80 via the memory bus 20. A separate RepairData signal 229 transfers data that tells the RAM 80 how to repair itself. This repair information is derived either from a self-test or from a remote fuse array 211 on the chip, or may be loaded in from an external source.

Before the wafer 10 is cut up, each chip 12 is tested for functionality. A series of finger probes 13 descend upon each chip in turn, making contact with pads 14 which connect to the input/output drivers of the chip 12. Through these connections, an external system 15 applies various signals, thoroughly testing the functionality of the chips.

A particular benefit of the present invention lies in the time savings during manufacture. Typically, during testing, before a wafer is cut into individual chips, the probe 13 descends on each chip 12 to test it. The test system 15 applies test stimuli via wafer probe 13, and generates a fault bitmap for each chip, which is off-loaded to the test system 15. The wafer probe is removed and the RAM 80 is repaired by selectively laser-zapping or cutting fuses 211. The wafer probe is again placed on the chip which is tested again to verify the laser-zapping. After the memory 80 is verified, the remainder of the chip's logic 16, which includes logic, is tested.

With the present invention, the laser repair step may be postponed because the array is able to self-repair. Thus the core logic 16 is tested and if a particular chip has been found to be bad, the extra steps of removing the probe, laser zapping and replacing the probe for a final test, have been obviated. In an alternate embodiment, no fuses are blown, saving the extra steps in every case. In this case, the RAM self-repairs upon each power up.

Figure 2:
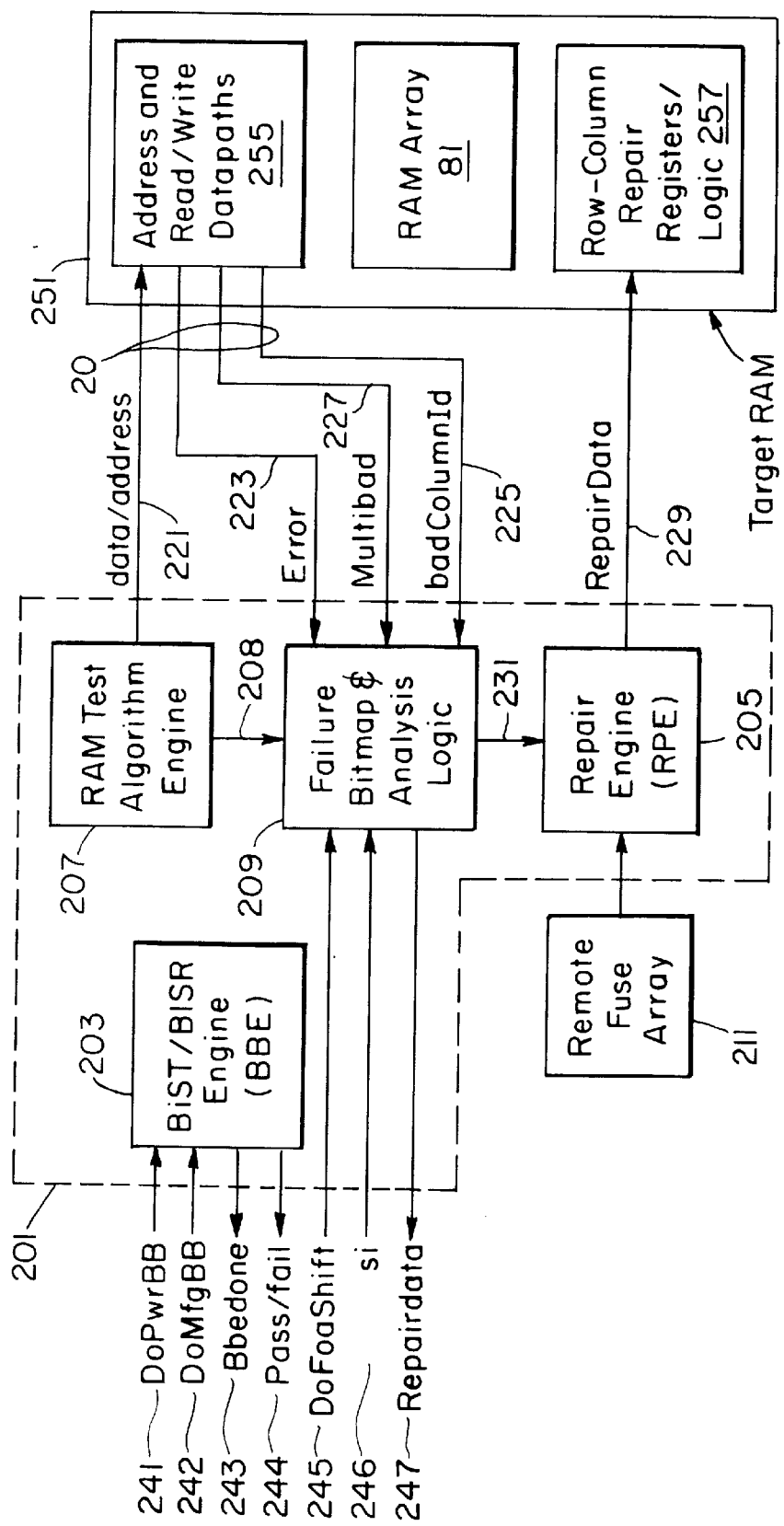
FIG. 2 is a block diagram of the repair architecture of the preferred embodiment of the present invention.

FIG. 2 shows the test and repair logic circuit 201, an embedded target RAM segment 251 and the remote fuse array 211. The control logic 201 includes the BiST/BiSR Engine (BBE) 203, the Repair Engine 205, the RAM Test Algorithm Engine 207 and the Failure CAM Array 209. The embedded target RAM segment 251 includes a RAM array 81, associated Address and Read/Write Datapath Logic 255 and the Row-Column Repair Registers and Logic 257.

The BBE 203 controls the sequence of self-test and self-repair steps for each RAM segment 251. The RAM Test Algorithm Machine 207 generates an address, data and read/write control signal 221 sequence according to some RAM testing algorithm, such as the well-known MARCH algorithm.

The BiST/BiSR Engine (BBE) 203 is a finite state machine that schedules the testing and repairing activities for the segments 251 in the RAM 80. It also allows a test system to extract repair information during manufacturing test. The BBE 203 begins its testing sequence at power up when the DoPwrBB signal 241 is asserted, or during manufacturing testing when the DoMfgBB signal 242 is asserted.

The Address and Read/Write Datapath Logic 255 passes the data, address and read/write control signals 221 generated by the RAM Test Algorithm Engine 207 on to the addressed RAM array 81. This logic 255 also compares the data read from the RAM array 81 with the expected data and upon an error, asserts an error signal 223 and provides the address 225 of a detected bad column slice. The address 225 may be encoded. If more than one column slice is faulty for a given address, the multibad signal 227 is asserted. A bad row address is provided (at 208) by the RAM Test Algorithm Engine 107.

The Failure Bitmap and Analysis Logic 209 receives and analyzes in real time the error 223 and multibad 227 signals, and the failing row and column addresses badColumnId 225 and badRowAddr 208, and maintains up-to-date failure bitmap information. This information is the basis of the self-repair, and is off-loaded to the test system via the on-chip pads 14 in one embodiment.

With the self-repair information now available, the external system programs the Remote Fuse Array 211 by burning or "blowing" selected fuses with a laser beam, thereby permanently storing the addresses of rows and column slices needing replacement.

This self-repair information is also presented to the Repair Engine 205 via 231. The Repair Engine 205 obtains the row and column repair data from either the Failure Bitmap and Analysis Logic 209 or from the Remote Fuse Array 211, and serially sends the same to the Row-Column Repair Registers/Logic 257 in the RAM segment 251 via line 229. The Row-Column Repair Registers/Logic 257 comprises a dynamic allocation map and is responsible for replacing the faulty row and column with the spares.

Figure 3:
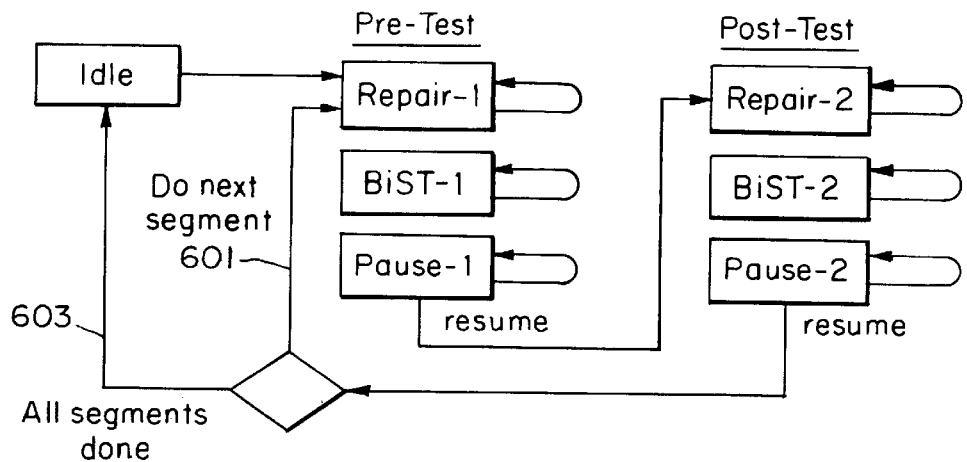
FIG. 3 is a flowchart corresponding to procedure executed by the BiST/BiSR Engine (BBE) of FIG. 2.

FIG. 3 is a flow diagram illustrating the operation of the BBE 203. The BBE remains in the Idle state until one of the DoPwrBB or DoMfgBB signals is asserted. It then performs two nearly identical sequences of steps, labeled Pre-Test and Post-Test, on each segment 81 in RAM. The Repair-1 step invokes the Repair Engine 205 (FIG. 2) and initializes the Row-Column Repair Registers and Logic 257 (FIG. 2) of the selected RAM segment 81.

The BiST-1 step invokes the RAM Test Algorithm Engine 207 which performs the self-test on the selected segment by alternately writing and reading 0s and 1s to the memory cells within the RAM segment 81, according to a memory test algorithm, such as the MARCH algorithm. Simultaneously, the Failure Bitmap and Analysis Logic 209 is updated as errors are detected.

The Pause-1 step halts the BiST/BiSR flow. During manufacturing test, which is initiated with a doMfgBB signal 235 (FIG. 2), the test system 15 off-loads the contents of the Failure Bitmap and Analysis Logic 209 by issuing a doFcaShift command 245. If required at this time, the contents of the Failure Bitmap and Analysis Logic 209 are also overwritten. When finished, the test system reissues the doMfgBB command 242 to resume the BiST/BiSR flow. During normal power-on automatic testing, which is initiated with the DoPwrBB command 241 (FIG. 2), the flow automatically resumes after waiting exactly one cycle in the Pause-1 state.

Like the Repair-1 step, the Repair-2 step invokes the Repair Engine 205 and, in addition, loads the RAM segment's repair registers either from the repair information stored in the Remote Fuse Array 211 if the permanent repair has already been programmed into the array by the test system 15. Otherwise, the loaded repair information is based on the repair information from the Failure Bitmap and Analysis Logic 209.

The BiST-2 and the Pause-2 steps are identical to the BiST-1 and the Pause-1 steps. The Pre-test and Post-test flow is repeated for every segment. Thus, after execution of the Post-test, branch 601 is taken if there are additional segments to be processed, while branch 603 is taken when testing is complete, i.e., when all segments have been processed.

Referring back to FIG. 2, the BBE asserts the Bbedone signal 243 when the test is complete and provides a pass/fail signal 244 to indicate whether RAM is repairable.

Figure 4:
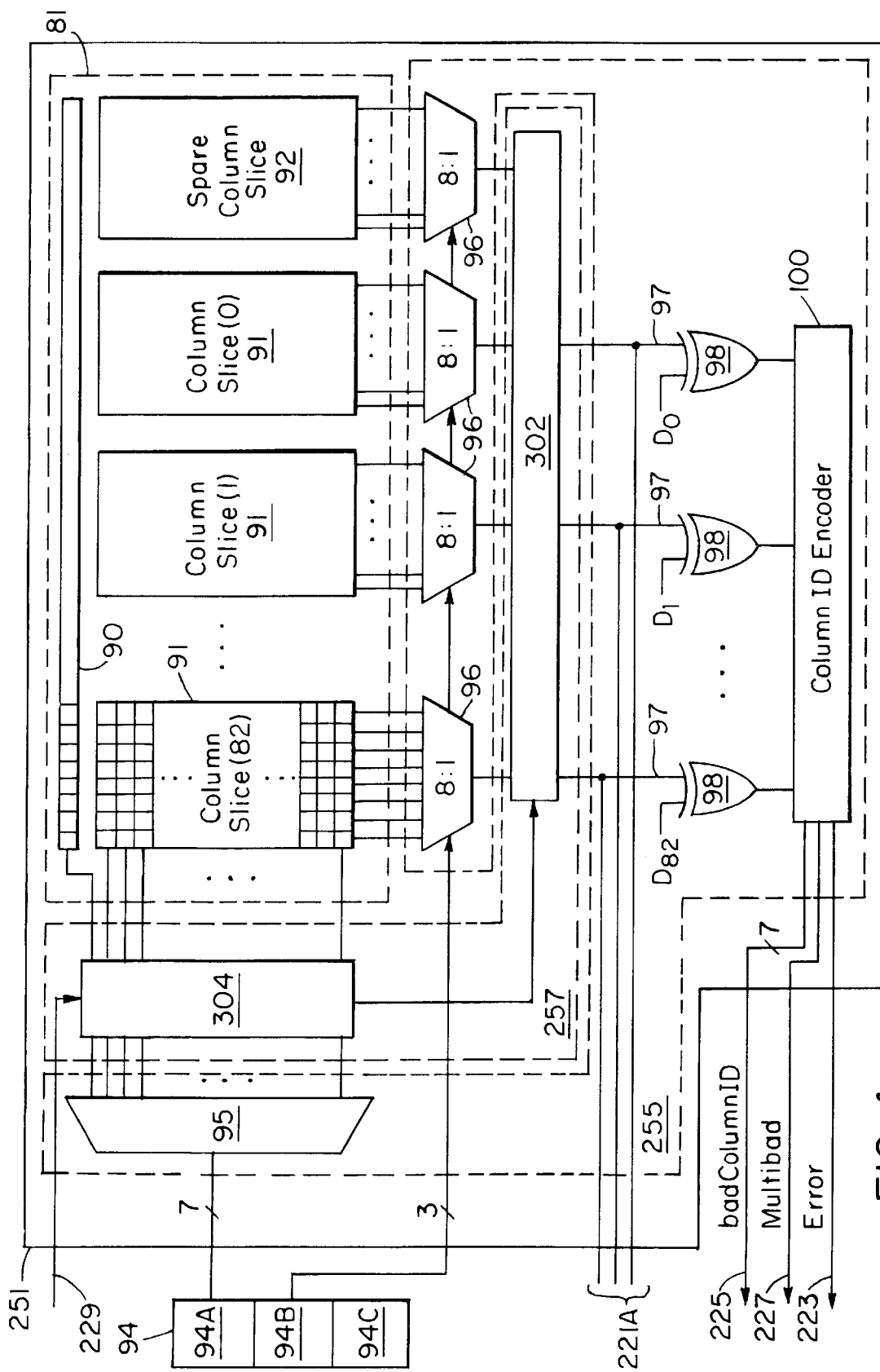
FIG. 4 is a block diagram illustrating a segment of an array from FIG. 1 according to a preferred embodiment of the present invention.

FIG. 4 illustrates the Address and Read/Write Datapath Logic 255, the RAM array 81, and the Row-Column Repair Registers and Logic 257 within a RAM segment 251. An address 94, which is part of the data/address lines 20 of FIG. 2, is logically divided into three portions 94A–94C. One portion 94C is used to select a particular RAM segment 251; 94A selects the row and 94B selects the memory cell column within each slice.

Without loss of generality, RAM array 81 is shown comprising eighty-three column slices 91, shown as Column Slice(0)–Column Slice(82), plus a spare column slice 92, which are all accessed in parallel. Each slice 91, 92 comprises 128 rows which are addressed by a 7-bit portion 94A of the address. Decoder 95 decodes this address portion 94A to select a particular row. A spare row 90 is also provided. The row repair register and logic 304 within the Row-Column Repair Registers and Logic 257 maps the spare row 90 to replace an identified faulty row, while the column repair register and logic 302 maps the spare column slice 92 to replace an identified faulty column slice.

Each column slice 91 is eight bits wide. For each slice, all eight bits of an addressed row are brought out of the slice, to a multiplexor 96, which selects the correct column using the column address 94B portion of the address 94. Thus, each non-spare RAM slice 91 directly corresponds to a bit of data in the host microprocessor's word width, which, in the preferred embodiment, is 83 bits.

During a test cycle, the RAM Test Algorithm Engine 207 writes to and reads from target cells. In the read operation, each data output bit 97 from the multiplexors 96 passes through the Column Repair Register and Logic 302, which may map the spare column slice 92 if mapping information is available. The read mapped data bits are then compared by XOR gates 98 with expected reference data fed to $D_0$–$D_{82}$ respectively. If the output value 97 is not the same as the expected written value $D_0$–$D_{82}$, an XOR gate outputs a 1. The XOR 98 outputs are then brought to the column ID encoder circuit 100, which, if only one slice is detected as faulty, provides the column slice address, or identifier, of the faulty slice on the badColumnID signal 225. On the other hand, if more than one slice is faulty, the multibad signal 227 is asserted. In either case, the error signal 223 is asserted. The output data 97 is available at 221A, which connects to the normal chip logic. The Column Repair Register and Logic 302 also maps input data to the spare column slice 92 if necessary.

Figure 5:
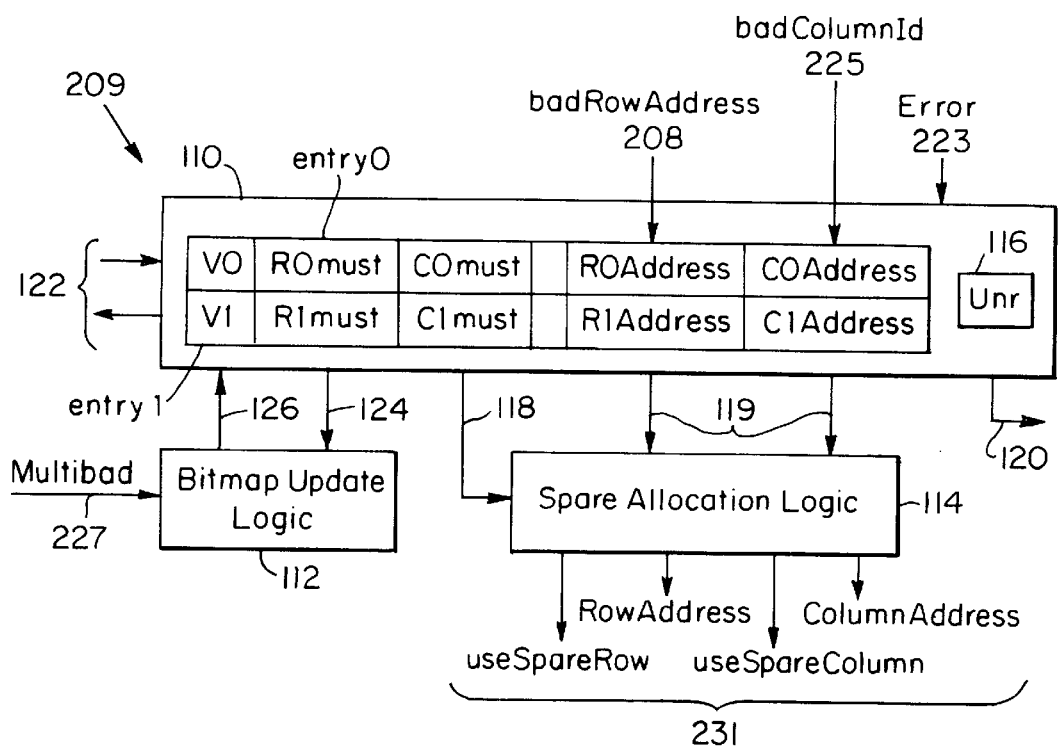
FIG. 5 is a block diagram of the Failure Bitmap and Analysis Logic of FIG. 2.

FIG. 5 shows the Failure Bitmap and Analysis Logic 209, comprising the Failure Bitmap CAM (content addressable memory) array 110, Bitmap Update Logic 112 and the Spare Allocation Logic 114.

In the preferred embodiment, the Failure Bitmap CAM array 110 has two entries, entry0 and entry1. Of course, an embodiment having more than one spare row and one spare column would require additional CAM entries. Fields labeled RxAddress and CxAddress, where x is the entry number (0 or 1), hold row and column addresses of up to two distinct faulty cells, where distinct cells are those which do not have common row or column addresses. Each entry also has three additional flags associated with it: a valid flag Vx, a row-must flag (Rxmust) and a column-must flag (Cxmust). The valid flag Vx simply indicates that entryx holds valid data. The Rxmust and Cxmust flags signify that the spare row or column must be substituted for the row or column, respectively, identified in the corresponding RxAddress or CxAddress field. In addition, there is an unrepairable flag 116 to indicate that the RAM array is not repairable.

In a preferred embodiment, the contents of the CAM array are shifted and overwritten serially via serial input and output lines 122 when a shiftFCA command issued from a controller.

The Bitmap Update Logic 112 takes as input the Multibad signal 227 as well as a collection of signals 124 from the Failure Bitmap CAM Array 110, described in detail in the discussion of FIG. 6 below. Whenever a faulty cell is detected, the Bitmap Update Logic applies the logic of Table 1 to these incoming signals 227, 124, and returns signals 126 back to the Failure Bitmap CAM Array 110, which control the next state of the Failure Bitmap CAM Array 110.

When a test has completed, the Must flags (Rxmust and Cxmust) are read by the Spare Allocation Logic 114 on lines 118. In addition, the row and column addresses stored in the Failure Bitmap CAM Array 110 are read on lines 119. The Spare Allocation Logic 114 applies the logic of Table 2 to decide how to allocate the spares, and provides the necessary information on lines 231. The useSpareRow signal indicates that the spare row should be substituted for the row whose address is indicated by RowAddress. Similarly, the useSpareColumn flag indicates that the spare column slice should be substituted for the column slice whose address is indicated by ColumnAddress.

Figure 6:
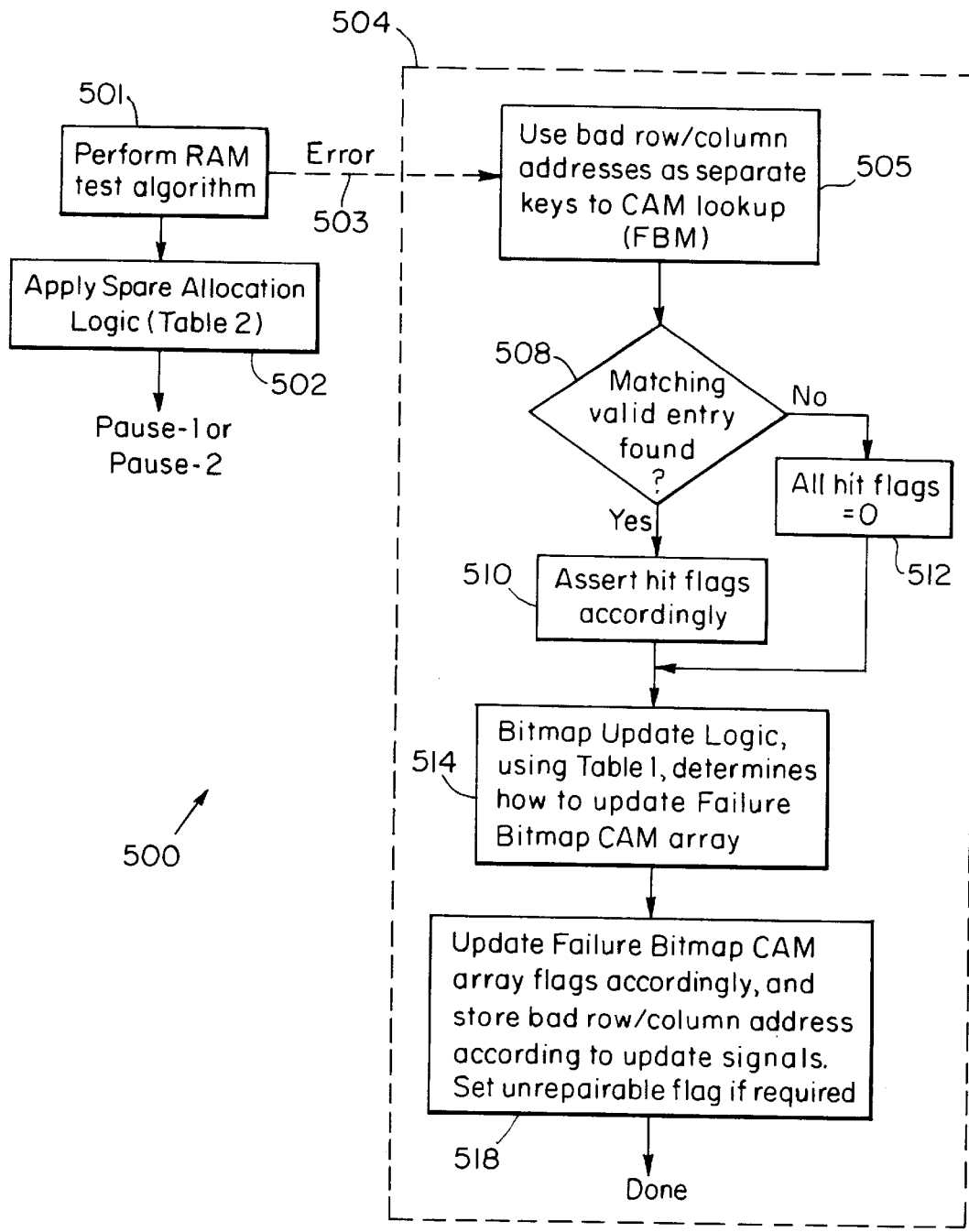
FIG. 6 is a flowchart of the test process of the present invention.

FIG. 6 is a flowchart 500 of the test process of the present invention, which takes place, for each segment, during the BiST1 and BiST2 steps shown in FIG. 3, and is described in conjunction with the previous figures. In step 501, a RAM test algorithm is continually executed until completion. A faulty cell is detected when data read from the cell does not match the previously written data.

Upon such a fault detection, the error signal 223 (FIGS. 2, 4, 5) is asserted and error processing, shown within dashed box 504, takes place. This error processing 504 occurs concurrently with the RAM test 501, as indicated by dashed line 503.

At step 505, the row and column addresses of the faulty cell, badRowAddress 208 and badColumnID 225 respectively are used as separate keys to perform a lookup within the Failure Bitmap CAM Array 110.

At step 508, it is determined whether a valid entry with a matching address has been found. If such an entry exists, the hit signals Rxhit and Cxhit, where x is the corresponding entry number, 0 or 1, are asserted to indicate the match (step 510). If no matching valid entry is found in the Failure Bitmap CAM Array 110, then, in step 512, all four hit signals are set to 0.

In step 514, the valid flags V0, V1, the row and column Must flags and hit flags, which constitute signals 124 of FIG. 5, and the Multibad signal 227, are all presented to the Bitmap Update Logic 112 which implements the logic of Table 1, to determine how the Failure Bitmap CAM Array 110 will be updated.

Table 1 is the truth table for the Bitmap Update Logic 112. The inputs 124, 104 to the Bitmap Update Logic 112 are indicated on the left side of Table 1 under the heading "Present State." The outputs 126 from the Bitmap Update Logic 112 back to the CAM array 110 are indicated on the right side of Table 1 under the heading "Next State."

For a given set of values for Vx, Rxmust, Cxmust, Rxhit, Cxhit and Multibad, Table 1 gives the next values for V1, Rxmust, Cxmust and the unrepairable flag. Updatex signals are generated to command the CAM array 110 to store the row and column addresses of a faulty bit into the indicated entry, or to retain the old addresses. V0 will always be set after the first faulty cell is detected and is therefore not shown in the Next State side (126) of Table 1.

For example, in the first line of Table 1, both valid flags are 0, i.e., neither entry is valid. R0hit is 0, meaning that the faulty cell's row address does not match entry0's stored address. As a result, the update0 signal is asserted and the faulty cell's row and column address are stored in entry0, whose valid flag V0 is set.

In step 518, V1 and the Must flags are set according to the Table 1 results from the Bitmap Update Logic 112. Row and column addresses of the faulty cell are stored in an entry if the corresponding updatex signal is asserted. If the RAM is found to be unrepairable by the Bitmap Update Logic 112, the Unrepairable flag 116 is set. In a preferred embodiment, testing continues even when the RAM is found to be unrepairable. Thus, a tester cycle is completely deterministic and is independent of the number of defects found.

The RAM test algorithm continues to test and process errors until the test is complete. When an entire segment has been tested, the algorithm is complete. The Spare Allocation Logic 114 takes the valid and must flags 118, and the stored row and column addresses 119 from the Failure Bitmap CAM Array 110, and applies the logic of Table 2 to decide how to allocate the spare row and column slice, indicating the decision via output signals 231 (FIG. 5). The repair engine 205 takes the information and transfers it to the repair registers 302, 304 located in the RAM segment. The process 500 repeats for each segment.

Figures 7, 8:
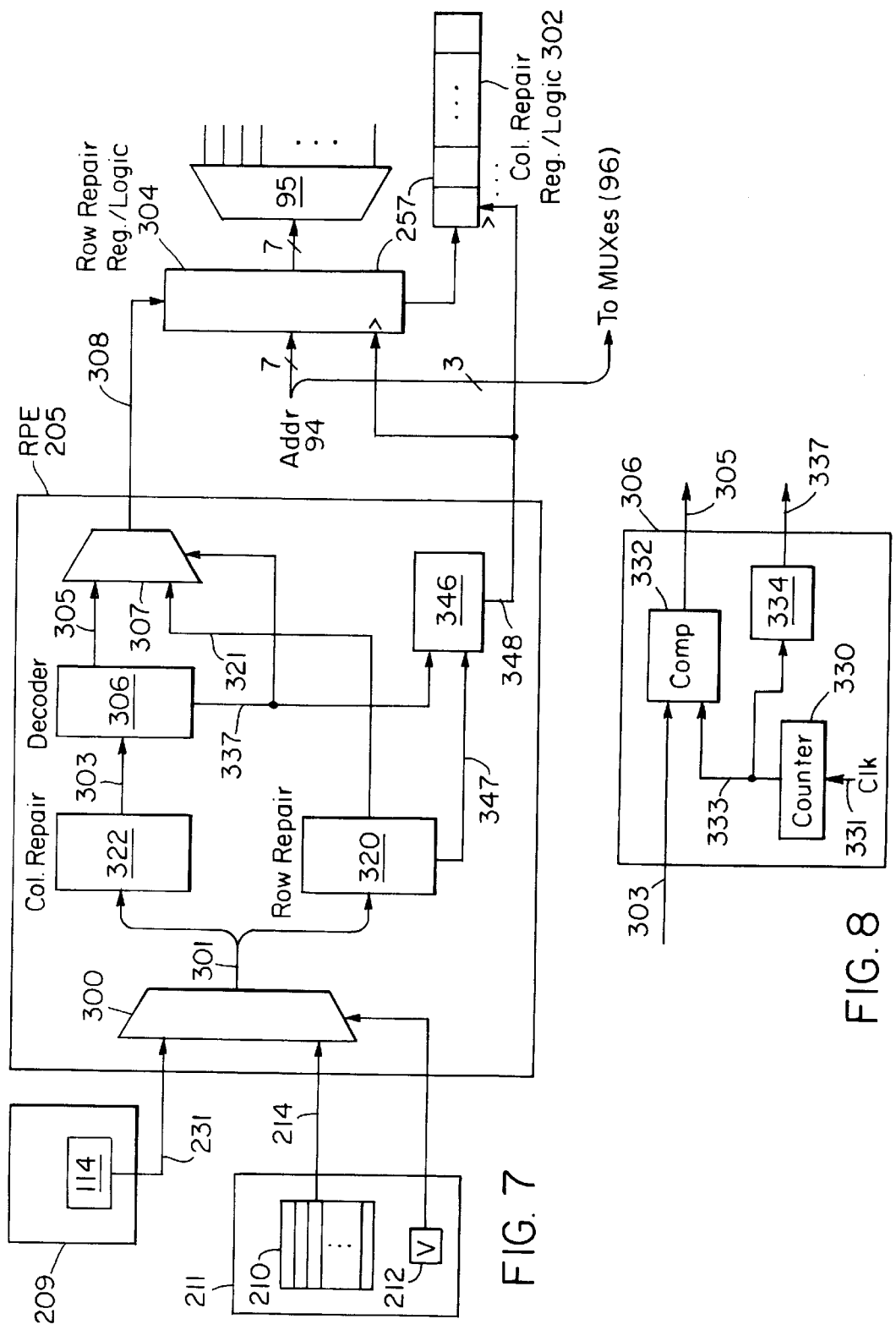
FIG. 7 is a schematic diagram of the Repair Engine of FIG. 2.
FIG. 8 is a schematic diagram of the decoder of FIG. 7.

FIG. 7 shows a preferred embodiment in which the Repair Engine (RPE) 205 comprises a multiplexor 300 for selecting faulty row and column address information from either the failure bitmap and analysis logic 209 or from the fuse array 211.

The RPE receives faulty row and column address information 130 from the Failure Bitmap and Analysis Logic (FBM) 209 at one of the two inputs to the RPE multiplexor 300. This information 231 is the direct result of the decisions made according to Table 2 from a self-test executed in the BiST-1 or BiST-2 steps of FIG. 3.

The fuse array 211 comprises a matrix 210 of fuses. Each line is dedicated to a memory segment 81. As data from each line is loaded from the fuse array 211, the data is presented at 214 to the other input of RPE multiplexor 300. In addition, there is a global valid indicator 212 to indicate whether the fuses have been programmed. The global valid indicator 212, by controlling the multiplexor 300, selects one of the two inputs: the fuse array line 214 if the fuse array information is valid, and the FBM information 130 otherwise.

The selected information 301 is then split up. Row repair information is routed to RPE row repair logic 320, and column information is routed to RPE column repair logic 322. The output 303 of the RPE column repair logic 322 is passed to a decoder 306 which decodes the column slice address to a word whose length equals the number of column slices, wherein all bits are 0 except the bit corresponding to column slice to be replaced.

The decoder output 305 and RPE row repair logic output 321 are brought to multiplexor 307 which selects one of the data signals 305, 321 and serially passes the information over serial line 308. A column shift clock signal 337 produced by the decoder 306 controls the selection of multiplexor 307. In addition, the column shift clock signal 337 and the row shift clock signal 347 generated by the row repair logic 320 are brought to the shift clock control circuit 346 which combines the signals into a single clock signal 348. This clock signal 348 is used to shift the serial information 308 into the column repair register 302 and the row repair register 304, both of which form part of the Row-Column Repair Register/Logic 257 of FIG. 2. The row repair information in the row repair register 304 is now decoded by decoder 95, which is the same decoder used to decode memory addresses 94.

In the preferred embodiment, there are 83 column slices, identified by seven bits. Since seven bits can identify $2^7=128$ possible column slices, obviously not all of the possible values are used. In fact, for various hardware reasons, it is beneficial to use encoded identifiers which are not all contiguous. See, for example, U.S. application Ser. No. 09/044,275, filed Mar. 19, 1998, assigned to Digital Equipment Corporation, and incorporated herein by reference.

FIG. 8 shows details of the decoder 306 of FIG. 7 which compensate for the fact that the column slice identifiers are not contiguous. The coded column slice address 303 is presented to one input of a comparator 332. The output 333 of a 7-bit counter 330 is presented to the other input of the comparator 332.

The counter 330 increments by one upon receiving a clock signal 331, covering the full range of 0 to 127. When the counter's value 333 is the same as the column slice identifier 303, the comparator outputs a 1. Otherwise, the comparator 332 outputs a 0. The comparator's output 305 is then fed to multiplexor 307 of FIG. 7.

The counter's value 333 is at the same time checked by a validity check circuit 334 to see if it is a valid encoded column slice identifier. Validity may be determined, among other methods, by comparing against a list of valid identifiers. In the preferred embodiment, validity is determined by counting the number of 1s in the counter value. If the number of 1s is a pre-determined value, the counter value corresponds to a valid column identifier.

Validity check circuit 334 output signal 337 serves as a column shift clock and also provides the multiplexor 307 control, as shown in FIG. 7. Where the counter value 333 corresponds to a valid output slice identifier, the output 337 provides a clock pulse on signal 337 and output 305 is selected by multiplexor 307. Where the counter valid does not correspond to a valid output slice identifier, no clock signal 337 is produced and the multiplexor 307 selects row shift data 321.

The preferred embodiment's use of a single pair of spare row and column slice drastically reduces the complexity of the update logic required for BiSR. The repair algorithm is perfect. That is, if a repair solution exists for a given failure bitmap, the preferred embodiment always finds it. The storage requirement for the failure bitmap is minimal. The repair analysis is performed on the fly with simple logic.

Furthermore, the row-column repair scheme of the preferred embodiment, combined with RAM segmenting affords much greater freedom in spare allocation, and therefore provides higher yield improvement than schemes that employ just the row-only or column-only repair.

The preferred embodiment's strategy of sequential testing and repairing of one RAM segment at a time allows almost all of the test and repair hardware to be shared among the segments, thus keeping the overall hardware overhead low. The only dedicated resources required in a RAM segment are the spares, the local row-column repair registers and the associated repair logic that disables defective row/column and enables the spares. This minimizes the impact of the test and repair logic on the chip yield.

The partitioning of the test and repair control logic allows the control logic to be placed at a convenient location. Only the most essential logic need be located with the target RAM array.

Finally, the preferred embodiment unifies self-repair during manufacturing and fuse-programmed permanent repair for field operation. The features of the Repair Engine allow all fuses to be located remotely at a convenient site on chip.

While this invention has been particularly shown and described with references to preferred embodiments thereof, it will be understood by those skilled in the art that various changes in form and details may be made therein without departing from the spirit and scope of the invention as defined by the appended claims.

For example, the spare column slice need not necessarily have the same width as the column slices. In other words, individual spare columns, or groups of columns, could serve to substitute for faulty individual columns or groups of columns, respectively. In this case, the column slice identifier would become a column or column group identifier. The term column slice address, whether encoded or not, has been intended to cover all of these concepts.

Of course, the present invention could be equally applied to groups of rows as well as to groups, or slices, of columns.

In addition, while the described embodiment comprises eighty-three column slices, each eight bits wide, and 128 rows, it will be obvious to one skilled in the art that these are exemplary numbers and that other quantities and widths are within the scope of the present invention.

Similarly, while Tables 1 and 2 describe a specific embodiment, it will be obvious to one skilled in the art that other logic which performs essentially the same function falls within the scope of the present invention.

TABLE 1

| Present State (227, 124) | | | | | | | | | | | Next State (126) | | | | | | | |
|---|---|---|---|---|---|---|---|---|---|---|---|---|---|---|---|---|---|---|
| V | V | R | C | R | C | R | C | R | C | M | V | R | C | R | C | U | U | U |
| 0 | 1 | 0 | 0 | 1 | 1 | 0 | 0 | 1 | 1 | U | 1 | 0 | 0 | 1 | 1 | N | P | P |
|   |   | M | M | M | M | H | H | H | H | L |   | M | M | M | M | R | D | D |
|   |   | U | U | U | U | I | I | I | I | T |   | U | U | U | U | E | A | A |
|   |   | S | S | S | S | T | T | T | T | Y |   | S | S | S | S | P | T | T |
|   |   | T | T | T | T |   |   |   |   |   |   | T | T | T | T |   | 0 | 1 |

No valid entries:

| | | | | | | | | | | | | | | | | | | |
|---|---|---|---|---|---|---|---|---|---|---|---|---|---|---|---|---|---|---|
| 0 | 0 | X | X | X | X | 0 | X | X | X | 0 | 0 | 0 | 0 | X | X | 0 | 1 | 0 |
| 0 | 0 | X | X | X | X | X | 0 | X | X | 0 | 0 | 0 | 0 | X | X | 0 | 1 | 0 |
| 0 | 0 | X | X | X | X | 0 | X | X | X | 1 | 0 | 1 | 0 | X | X | 0 | 1 | 0 |

TABLE 1-continued

| Present State (227, 124) | | | | | | | | | | | Next State (126) | | | | | | | |
|---|---|---|---|---|---|---|---|---|---|---|---|---|---|---|---|---|---|---|
| V0 | V1 | RMUST | CMUST | RMUST | CMUST | RHIT | CHIT | RHIT | CHIT | MULTY | V1 | RMUST | CMUST | RMUST | CMUST | UNREP0 | UPDAT0 | UPDAT1 |

Entry 0 valid. Combinations of entry 0 r0must, c0must:

| V0 | V1 | RM | CM | RM | CM | RH | CH | RH | CH | ML | V1 | RM | CM | RM | CM | UN | UP0 | UP1 |
|---|---|---|---|---|---|---|---|---|---|---|---|---|---|---|---|---|---|---|
| 1 | 0 | 0 | 0 | X | X | 0 | 0 | X | X | 0 | 1 | 0 | 0 | 0 | 0 | 0 | 0 | 1 |
| 1 | 0 | 0 | 0 | X | X | 0 | 1 | X | X | 0 | 0 | 0 | 1 | X | X | 0 | 0 | X |
| 1 | 0 | 0 | 0 | X | X | 1 | 0 | X | X | 0 | 0 | 1 | 0 | X | X | 0 | 0 | X |
| 1 | 0 | 0 | 0 | X | X | 1 | 1 | X | X | 0 | 0 | 0 | 0 | X | X | 0 | X | X |
| 1 | 0 | 0 | 1 | X | X | 0 | 0 | X | X | 0 | 1 | 0 | 1 | 1 | 0 | 0 | 0 | 1 |
| 1 | 0 | 0 | 1 | X | X | 0 | 1 | X | X | 0 | 0 | 0 | 1 | X | X | 0 | 0 | X |
| 1 | 0 | 0 | 1 | X | X | 1 | 0 | X | X | 0 | 0 | 1 | 1 | X | X | 0 | 0 | X |
| 1 | 0 | 0 | 1 | X | X | 1 | 1 | X | X | 0 | 0 | 0 | 1 | X | X | 0 | X | X |
| 1 | 0 | 1 | 0 | X | X | 0 | 0 | X | X | 0 | 1 | 1 | 0 | 0 | 1 | 0 | 0 | 1 |
| 1 | 0 | 1 | 0 | X | X | 0 | 1 | X | X | 0 | 0 | 1 | 1 | X | X | 0 | 0 | X |
| 1 | 0 | 1 | 0 | X | X | 1 | 0 | X | X | 0 | 0 | 1 | 0 | X | X | 0 | X | X |
| 1 | 0 | 1 | 0 | X | X | 1 | 1 | X | X | 0 | 0 | 1 | 0 | X | X | 0 | X | X |
| 1 | 0 | 1 | 1 | X | X | 0 | 0 | X | X | 0 | 0 | 1 | 1 | 0 | 0 | 1 | 0 | X |
| 1 | 0 | 1 | 1 | X | X | 0 | 1 | X | X | 0 | 0 | 1 | 1 | X | X | 0 | 0 | X |
| 1 | 0 | 1 | 1 | X | X | 1 | 0 | X | X | 0 | 0 | 1 | 1 | X | X | 0 | 0 | X |
| 1 | 0 | 1 | 1 | X | X | 1 | 1 | X | X | 0 | 0 | 1 | 1 | X | X | 0 | X | X |
| 1 | 0 | 0 | 0 | X | X | 0 | 0 | X | X | 1 | 1 | 0 | 1 | 1 | 0 | 0 | 0 | 1 |
| 1 | 0 | 0 | 0 | X | X | 0 | 1 | X | X | 1 | 0 | 1 | 1 | X | X | 0 | 1 | 0 |
| 1 | 0 | 0 | 0 | X | X | 1 | 0 | X | X | 1 | 0 | 1 | 0 | X | X | 0 | 0 | X |
| 1 | 0 | 0 | 0 | X | X | 1 | 1 | X | X | 1 | 0 | 1 | 0 | X | X | 0 | X | X |
| 1 | 0 | 0 | 1 | X | X | 0 | 0 | X | X | 1 | 1 | 0 | 1 | 1 | 0 | 0 | 0 | 1 |
| 1 | 0 | 0 | 1 | X | X | 0 | 1 | X | X | 1 | 0 | 1 | 1 | X | X | 0 | 1 | 0 |
| 1 | 0 | 0 | 1 | X | X | 1 | 0 | X | X | 1 | 0 | 1 | 1 | X | X | 0 | 0 | X |
| 1 | 0 | 0 | 1 | X | X | 1 | 1 | X | X | 1 | 0 | 1 | 1 | X | X | 0 | X | X |
| 1 | 0 | 1 | 0 | X | X | 0 | 0 | X | X | 1 | 0 | 1 | 0 | X | X | 1 | 0 | X |
| 1 | 0 | 1 | 0 | X | X | 0 | 1 | X | X | 1 | 0 | 1 | 0 | X | X | 1 | 0 | X |
| 1 | 0 | 1 | 0 | X | X | 1 | 0 | X | X | 1 | 0 | 1 | 0 | X | X | 0 | X | X |
| 1 | 0 | 1 | 0 | X | X | 1 | 1 | X | X | 1 | 0 | 1 | 0 | X | X | 0 | X | X |
| 1 | 0 | 1 | 1 | X | X | 0 | 0 | X | X | 1 | 0 | 1 | 1 | X | X | 1 | 0 | X |
| 1 | 0 | 1 | 1 | X | X | 0 | 1 | X | X | 1 | 0 | 1 | 1 | X | X | 1 | 0 | X |
| 1 | 0 | 1 | 1 | X | X | 1 | 0 | X | X | 1 | 0 | 1 | 1 | X | X | 0 | 0 | X |
| 1 | 0 | 1 | 1 | X | X | 1 | 1 | X | X | 1 | 0 | 1 | 1 | X | X | 0 | X | X |

Both Entries are valid. Musts are not set:

| V0 | V1 | RM | CM | RM | CM | RH | CH | RH | CH | ML | V1 | RM | CM | RM | CM | UN | UP0 | UP1 |
|---|---|---|---|---|---|---|---|---|---|---|---|---|---|---|---|---|---|---|
| 1 | 1 | 0 | 0 | 0 | 0 | 0 | 0 | 0 | 0 | 0 | 1 | 0 | 0 | 0 | 0 | 1 | 0 | 0 |
| 1 | 1 | 0 | 0 | 0 | 0 | 0 | 0 | 1 | 0 | 0 | 1 | 1 | 0 | 0 | 1 | 0 | 0 | 0 |
| 1 | 1 | 0 | 0 | 0 | 0 | 0 | 1 | 0 | 0 | 0 | 1 | 0 | 1 | 1 | 0 | 0 | 0 | 0 |
| 1 | 1 | 0 | 0 | 0 | 0 | 0 | 1 | 1 | 0 | 0 | 1 | 0 | 0 | 0 | 0 | 0 | 0 | X |
| 1 | 1 | 0 | 0 | 0 | 0 | 1 | 0 | 0 | 0 | 0 | 1 | 0 | 1 | 1 | 0 | 0 | 0 | 0 |
| 1 | 1 | 0 | 0 | 0 | 0 | 1 | 1 | 0 | 0 | 0 | 1 | 0 | 1 | 1 | 0 | 0 | 0 | 0 |
| 1 | 1 | 0 | 0 | 0 | 1 | 0 | 0 | 0 | 0 | 0 | 1 | 1 | 0 | 0 | 1 | 0 | 0 | 0 |
| 1 | 1 | 0 | 0 | 0 | 1 | 0 | 0 | 1 | 0 | 0 | 1 | 1 | 0 | 0 | 1 | 0 | 0 | 0 |
| 1 | 1 | 0 | 0 | 0 | 1 | 1 | 0 | 0 | 0 | 0 | 1 | 0 | 0 | 0 | 0 | 0 | X | 0 |

Both Entries are valid. r0must and c1must are set:

| V0 | V1 | RM | CM | RM | CM | RH | CH | RH | CH | ML | V1 | RM | CM | RM | CM | UN | UP0 | UP1 |
|---|---|---|---|---|---|---|---|---|---|---|---|---|---|---|---|---|---|---|
| 1 | 1 | 1 | 0 | 0 | 1 | 0 | 0 | 0 | 0 | 0 | 1 | 1 | 0 | 0 | 1 | 1 | 0 | 0 |
| 1 | 1 | 1 | 0 | 0 | 1 | 0 | 0 | 1 | 0 | 0 | 1 | 1 | 0 | 0 | 1 | 0 | 0 | 0 |
| 1 | 1 | 1 | 0 | 0 | 1 | 0 | 1 | 0 | 0 | 0 | 1 | 1 | 0 | 0 | 1 | 1 | 0 | 0 |
| 1 | 1 | 1 | 0 | 0 | 1 | 0 | 1 | 1 | 0 | 0 | 1 | 1 | 0 | 0 | 1 | 0 | 0 | X |
| 1 | 1 | 1 | 0 | 0 | 1 | 1 | 0 | 0 | 0 | 0 | 1 | 1 | 0 | 0 | 1 | 1 | 0 | 0 |
| 1 | 1 | 1 | 0 | 0 | 1 | 1 | 1 | 0 | 0 | 0 | 1 | 1 | 0 | 0 | 1 | 1 | 0 | 0 |
| 1 | 1 | 1 | 0 | 0 | 1 | 1 | 0 | 1 | 0 | 0 | 1 | 1 | 0 | 0 | 1 | 0 | 0 | 0 |
| 1 | 1 | 1 | 0 | 0 | 1 | 1 | 0 | 0 | 1 | 0 | 1 | 1 | 0 | 0 | 1 | 0 | 0 | 0 |
| 1 | 1 | 1 | 0 | 0 | 1 | 1 | 1 | 0 | 0 | 0 | 1 | 1 | 0 | 0 | 1 | 0 | 0 | 0 |

Both Entries are valid. c0must and r1must are set:

| V0 | V1 | RM | CM | RM | CM | RH | CH | RH | CH | ML | V1 | RM | CM | RM | CM | UN | UP0 | UP1 |
|---|---|---|---|---|---|---|---|---|---|---|---|---|---|---|---|---|---|---|
| 1 | 1 | 0 | 1 | 1 | 0 | 0 | 0 | 0 | 0 | 0 | 1 | 0 | 1 | 1 | 0 | 1 | 0 | 0 |
| 1 | 1 | 0 | 1 | 1 | 0 | 0 | 0 | 0 | 1 | 0 | 1 | 0 | 1 | 1 | 0 | 1 | 0 | 0 |
| 1 | 1 | 0 | 1 | 1 | 0 | 0 | 0 | 1 | 0 | 0 | 1 | 0 | 1 | 1 | 0 | 0 | 0 | 0 |
| 1 | 1 | 0 | 1 | 1 | 0 | 0 | 0 | 1 | 1 | 0 | 1 | 0 | 1 | 1 | 0 | 0 | 0 | X |
| 1 | 1 | 0 | 1 | 1 | 0 | 0 | 1 | 0 | 0 | 0 | 1 | 0 | 1 | 1 | 0 | 0 | 0 | 0 |
| 1 | 1 | 0 | 1 | 1 | 0 | 0 | 1 | 1 | 0 | 0 | 1 | 0 | 1 | 1 | 0 | 0 | 0 | 0 |
| 1 | 1 | 0 | 1 | 1 | 0 | 1 | 0 | 0 | 0 | 0 | 1 | 0 | 1 | 1 | 0 | 1 | 0 | 0 |
| 1 | 1 | 0 | 1 | 1 | 0 | 1 | 0 | 0 | 1 | 0 | 1 | 0 | 1 | 1 | 0 | 1 | 0 | 0 |
| 1 | 1 | 0 | 1 | 1 | 0 | 1 | 1 | 0 | 0 | 0 | 1 | 0 | 1 | 1 | 0 | 0 | X | 0 |

TABLE 1-continued

| Present State (227, 124) | | | | | | | | | | Next State (126) | | | | | | | |
|---|---|---|---|---|---|---|---|---|---|---|---|---|---|---|---|---|---|
| V0 | V1 | R0MUST | C0MUST | R1MUST | C1MUST | R0HIT | C0HIT | R1HIT | C1HIT | MULTY | V1 | R0MUST | C0MUST | R1MUST | C1MUST | UNREP0 | UPDAT0 | UPDAT1 |

Multibad set. Both Entries are valid. Musts are not set:

| 1 | 1 | 0 | 0 | 0 | 0 | 0 | 0 | 0 | 0 | 1 | 1 | 0 | 0 | 0 | 0 | 1 | 0 | 0 |
| 1 | 1 | 0 | 0 | 0 | 0 | 0 | 0 | 0 | 1 | 1 | 1 | 0 | 0 | 0 | 0 | 1 | 0 | 0 |
| 1 | 1 | 0 | 0 | 0 | 0 | 0 | 0 | 1 | 0 | 1 | 1 | 0 | 1 | 1 | 0 | 0 | 0 | 0 |
| 1 | 1 | 0 | 0 | 0 | 0 | 0 | 0 | 1 | 1 | 1 | 1 | 0 | 1 | 1 | 0 | 0 | 0 | 0 |
| 1 | 1 | 0 | 0 | 0 | 0 | 0 | 1 | 0 | 0 | 1 | 1 | 0 | 0 | 0 | 0 | 1 | 0 | 0 |
| 1 | 1 | 0 | 0 | 0 | 0 | 0 | 1 | 1 | 0 | 1 | 1 | 0 | 1 | 1 | 0 | 0 | 0 | 0 |
| 1 | 1 | 0 | 0 | 0 | 0 | 1 | 0 | 0 | 0 | 1 | 1 | 1 | 0 | 0 | 1 | 0 | 0 | 0 |
| 1 | 1 | 0 | 0 | 0 | 0 | 1 | 0 | 0 | 1 | 1 | 1 | 1 | 0 | 0 | 1 | 0 | 0 | 0 |
| 1 | 1 | 0 | 0 | 0 | 0 | 1 | 1 | 0 | 0 | 1 | 1 | 1 | 0 | 0 | 1 | 0 | X | 0 |

Both Entries are valid. r0must and c1must are set:

| 1 | 1 | 1 | 0 | 0 | 1 | 0 | 0 | 0 | 0 | 1 | 1 | 1 | 0 | 0 | 1 | 1 | 0 | 0 |
| 1 | 1 | 1 | 0 | 0 | 1 | 0 | 0 | 0 | 1 | 1 | 1 | 1 | 0 | 0 | 1 | 1 | 0 | 0 |
| 1 | 1 | 1 | 0 | 0 | 1 | 0 | 0 | 1 | 0 | 1 | 1 | 1 | 0 | 0 | 1 | 1 | 0 | 0 |
| 1 | 1 | 1 | 0 | 0 | 1 | 0 | 0 | 1 | 1 | 1 | 1 | 1 | 0 | 0 | 1 | 1 | 0 | X |
| 1 | 1 | 1 | 0 | 0 | 1 | 0 | 1 | 0 | 0 | 1 | 1 | 1 | 0 | 0 | 1 | 1 | 0 | 0 |
| 1 | 1 | 1 | 0 | 0 | 1 | 0 | 1 | 1 | 0 | 1 | 1 | 1 | 0 | 0 | 1 | 1 | 0 | 0 |
| 1 | 1 | 1 | 0 | 0 | 1 | 1 | 0 | 0 | 0 | 1 | 1 | 1 | 0 | 0 | 1 | 0 | 0 | 0 |
| 1 | 1 | 1 | 0 | 0 | 1 | 1 | 0 | 0 | 1 | 1 | 1 | 1 | 0 | 0 | 1 | 0 | 0 | 0 |
| 1 | 1 | 1 | 0 | 0 | 1 | 1 | 1 | 0 | 0 | 1 | 1 | 1 | 0 | 0 | 1 | 0 | 0 | 0 |

Both Entries are valid. c0must and r1must are set:

| 1 | 1 | 0 | 1 | 1 | 0 | 0 | 0 | 0 | 0 | 1 | 1 | 0 | 1 | 1 | 0 | 1 | 0 | 0 |
| 1 | 1 | 0 | 1 | 1 | 0 | 0 | 0 | 0 | 1 | 1 | 1 | 0 | 1 | 1 | 0 | 1 | 0 | 0 |
| 1 | 1 | 0 | 1 | 1 | 0 | 0 | 0 | 1 | 0 | 1 | 1 | 0 | 1 | 1 | 0 | 0 | 0 | 0 |
| 1 | 1 | 0 | 1 | 1 | 0 | 0 | 0 | 1 | 1 | 1 | 1 | 0 | 1 | 1 | 0 | 0 | 0 | X |
| 1 | 1 | 0 | 1 | 1 | 0 | 0 | 1 | 0 | 0 | 1 | 1 | 0 | 1 | 1 | 0 | 1 | 0 | 0 |
| 1 | 1 | 0 | 1 | 1 | 0 | 0 | 1 | 1 | 0 | 1 | 1 | 0 | 1 | 1 | 0 | 0 | 0 | 0 |
| 1 | 1 | 0 | 1 | 1 | 0 | 1 | 0 | 0 | 0 | 1 | 1 | 0 | 1 | 1 | 0 | 1 | 0 | 0 |
| 1 | 1 | 0 | 1 | 1 | 0 | 1 | 0 | 0 | 1 | 1 | 1 | 0 | 1 | 1 | 0 | 1 | 0 | 0 |
| 1 | 1 | 0 | 1 | 1 | 0 | 1 | 1 | 0 | 0 | 1 | 1 | 0 | 1 | 1 | 0 | 1 | X | 0 |

TABLE 2

Repair Solutions in the Row-Column Repair Scheme

| valid 0 | valid 1 | r0must | c0must | r1must | c1must | unrep | repair solution |
|---|---|---|---|---|---|---|---|
| 0 | 0 | X | X | X | X | 0 | No repair needed |
| 1 | X | X | X | X | X | 1 | Array is unrepairable |
| 1 | 0 | 0 | 0 | X | X | 0 | Use col0idx for column repair |
| 1 | 0 | 1 | 0 | X | X | 0 | Use row0idx for row repair. |
| 1 | 0 | 0 | 1 | X | X | 0 | Use col0idx for column repair |
| 1 | 0 | 1 | 1 | X | X | 0 | Use row0idx for row repair and col0idx for column repair. |
| 1 | 1 | 0 | 0 | 0 | 0 | 0 | Use col0idx for column repair and row1idx for row repair. |
| 1 | 1 | 1 | 0 | 0 | 1 | 0 | Use row0idx for row repair and col1idx for column repair. |
| 1 | 1 | 0 | 1 | 1 | 0 | 0 | Use col0idx for column repair and row1idx for row repair. |

What is claimed is:

1. A self-repair method for a random access memory (RAM) array on a chip, the array having a plurality of memory cells addressed by their respective columns and rows, the method comprising:

providing at least one spare row of memory cells and at least one spare column of memory cells;

providing a failure bitmap having plural entries, each entry comprising a row address field and a column address field for storing a row address and a column address of a detected faulty cell, a row substitute indicator, and a column substitute indicator;

detecting a faulty memory cell whose row/column address matches a row/column address stored in a failure bitmap entry, thus indicating that there are plural faulty memory cells within the addressed row/column, and setting the respective row/column substitute indicator of the matching entry to indicate that the spare row/column must be used to substitute for the row/column containing the faulty memory cell;

detecting a faulty memory cell whose row/column address does not match any row/column address stored in the failure bitmap, and storing the row and column addresses of the detected faulty memory cell in row and column address fields of an entry that does not yet hold valid content; and after detecting all faulty memory cells, allocating the spare rows and spare columns, based on the row and column address fields and row/column indicator settings of the failure bitmap;

each of the above steps being performed by logic resident on the chip.

2. The method of claim 1, wherein detecting faulty memory cells comprises:

writing a value to the memory array;

reading a value from the memory array; and comparing the read and write values to identify faulty memory cells in the memory array.

3. The method of claim 1 wherein a column width comprises a plurality of bits.

4. The method of claim 1, wherein allocating spare rows comprises:

allocating spare rows and spare columns to rows and columns respectively that have been indicated by the substitute indicators as requiring replacement; and allocating remaining spare rows and spare columns to remaining rows and columns whose row and column addresses respectively have been stored.

5. The method of claim 1, the chip containing core logic, further comprising:

after repairing the RAM array, using the RAM array to test the core logic.

6. The method of claim 4, further comprising:

flagging the RAM as unrepairable if the RAM cannot be repaired by the spare rows or spare columns.

7. A random access memory array (RAM), comprising:

a plurality of memory cells addressed by their respective columns and rows;

at least one spare row of memory cells;

at least one spare column of memory cells;

a test and repair logic circuit for locating faulty cells within the memory array;

a failure bitmap having at least two entries, each entry comprising a row address field and a column address field for storing a row address and a column address of a faulty cell detected by the test and repair logic circuit, a row substitute indicator and a column substitute indicator, the test and repair logic, upon detection of a faulty memory cell, setting, if the detected faulty memory cell's row/column address matches a row/column address stored in the failure bitmap, thus indicating that there are plural faulty memory cells within the addressed row/column, the respective row/column substitute indicator of the failure bitmap entry having the matching row/column address to indicate that the spare row/column must be used to substitute for the row/column having the matching row/column address, and setting, if no match occurs, the row and column addresses of the detected faulty memory cell in the row and column address fields of a failure bitmap entry that does not yet hold valid content; and spare allocation logic circuit which, after all faulty memory cells have been detected, allocates the spare rows and spare columns, based on the row and column address fields and row/column indicator settings of the failure bitmap.

8. The RAM of claim 7, wherein each column has a width comprising a plurality of bits.

9. The RAM of claim 8 wherein a column address is a unique identifier which identifies a column.

10. A random access memory array (RAM), comprising:

a plurality of memory cells addressed by their respective columns and rows;

at least one spare row of memory cells;

at least one spare column of memory cells;

a test and repair logic circuit for locating faulty cells within the memory array;

a failure bitmap having at least two entries, each entry comprising a row address field and a column address field for storing a row address and a column address of a faulty cell detected by the test and repair logic circuit, an Rmust indication for indicating that a row referenced in the row address field must be replaced with a spare row, and a Cmust indication for indicating that a column referenced in the column address field must be replaced with a spare column;

spare allocation logic circuit which uses contents from the failure bitmap to allocate the spare rows and spare columns; and an array of fuses, wherein allocation information is burned into the fuses, and wherein the allocation information is read from the fuse array upon startup.

11. A random access memory array (RAM), comprising:

a plurality of memory cells addressed by their respective columns and rows;

at least one spare row of memory cells;

at least one spare column of memory cells;

a test and repair logic circuit for locating faulty cells within the memory array;

a failure bitmap having at least two entries, each entry comprising a row address field and a column address field for storing a row address and a column address of a faulty cell detected by the test and repair logic circuit, a first indicator for indicating that a row referenced in the row address field must be replaced with a spare row, and a second indicator for indicating that a column referenced in the column address field must be replaced with a spare column;

spare allocation logic circuit allocates the spare rows and spare columns, based on the row and column address fields and on the first and second indicators; and an allocation map, wherein the test and repair logic circuit executes a dynamic test at start up, and stores row and column allocations in the allocation map.

12. The RAM of claim 11, further comprising an array of fuses, wherein allocation information is burned into the fuses, and wherein it is read from the fuse array upon startup if the fuse array allocation information is valid, and is read from the failure bitmap if the fuse array allocation information is not valid.

13. A computer system comprising a chip, the chip comprising:
   a random access memory (RAM) array, the RAM comprising
      a plurality of memory cells addressed according to their respective columns and rows,
      at least one spare row of memory cells, and
      at least one spare column of memory cells;
   a test and repair logic circuit for locating faulty cells within the memory array;
   a failure bitmap having at least two entries, each entry comprising
      a row address field and a column address field for storing a row address and a column address of a first faulty cell detected by the test and repair logic circuit,
      a first indicator for indicating, if the test and repair circuitry detects a second faulty cell having a row address that matches the row address stored in the row address field, that a row referenced in the row address field must be replaced with a spare row, and
      a second indicator for indicating, if the test and repair circuitry detects a second faulty cell having a column address that matches the column address stored in the column address field, that a column referenced in the column address field must be replaced with a spare column; and
   spare allocation logic circuit which, after testing of the RAM, allocates the spare rows and spare columns based on the row and column address fields and the first and second indicators.

14. The computer system of claim 13, further comprising an allocation map, wherein the test and repair logic circuit executes a dynamic test at start up, and stores row and column allocations in the allocation map.

15. The computer system of claim 13, the chip further comprising core logic.

16. A computer system, comprising:
   a random access memory array (RAM) which further comprises:
      a plurality of memory cells addressed by their respective columns and rows;
      at least one spare row of memory cells;
      at least one spare column of memory cells;
      a repair logic circuit for locating faulty cells within the memory array;
      a failure bitmap having at least two entries, each entry comprising
         a row address field and a column address field for storing a row address and a column address of a faulty cell detected by the repair logic circuit,
         a first indicator for indicating that a row referenced in the row address field must be replaced with a spare row, and
         a second indicator for indicating that a column referenced in the column address field must be replaced with a spare column;
   spare allocation logic circuit which allocates the spare rows and spare columns based on the row and column address fields and the first and second indicators;
   an allocation map, wherein the test and repair logic circuit executes a dynamic test at start up, and stores row and column allocations in the allocation map; and
   an array of fuses, wherein allocation information is burned into the fuses, and wherein the allocation information is read from the fuse array upon startup if the fuse array allocation information is valid, and is read from the allocation map if the fuse array allocation information is not valid.

17. A semiconductor chip, comprising:
   a random access memory (RAM) array means having a plurality of memory cells addressed according to their respective columns and rows, comprising:
      row replacement means for replacing a row containing at least one faulty memory cell;
      column replacement means for replacing a column containing at least one faulty memory cell;
      failure bitmap means comprising plural entries, each entry comprising
         storage means for storing a row address and a column address of a detected faulty cell,
         row substitute indicator means, and
         column substitute indicator means;
   means for detecting a faulty memory cell whose row/column address matches a row/column address stored in a failure bitmap means entry, and for setting, upon said detecting, the respective row/column substitute indicator means of said matching entry, and
   means for detecting a faulty memory cell whose row/column address does not match any row/column address stored in the failure bitmap means, and for storing the row and column addresses of said faulty memory cell in said storage means of an entry that does not yet hold valid content; and
   means for allocating, after testing of the RAM, the spare row/column replacement means based on the stored row and column addresses and row/column substitute indicator means settings of the failure bitmap means.

18. The semiconductor chip of claim 17, further comprising:
   core logic means.

19. A random access memory array (RAM), comprising:
   a plurality of memory cells addressed by their respective columns and rows;
   a test and repair logic circuit for locating faulty cells within the memory array;
   at least one spare column of memory cells;
   spare allocation logic circuit which allocates the at least one spare column to replace a column with a faulty cell;
   a column identifier encoder for encoding a column identifier of a column having a faulty cell;
   storage means for storing an encoded column identifier; and
   a decoder for decoding an encoded identifier, the decoder further comprising:
      a counter which cycles through at least all allowed encoded identifier values,
      a comparator for comparing the counter's value with a stored encoded identifier, the comparator output being indicative of a match, and
      a circuit for determining whether the counter's value is a valid encoded identifier, and for providing an indication thereof, such that when an encoded identifier is indicated as valid, the comparator output is sent to the spare allocation logic circuit, and the at least one spare column allocated accordingly.

20. The RAM of claim 19, further comprising:
   at least one spare row of memory cells; and a failure bitmap having at least two entries, each entry comprising
- a row address field and a column address field for storing a row address and an encoded column address of a faulty cell detected by the test and repair logic circuit,
- an Rmust flag for indicating that a row indicated in the row address field must be replaced with a spare row, and
- a Cmust bit for indicating that a column indicated in the column address field must be replaced with a spare column.

21. A self-repair method for a random access memory (RAM) having a plurality of memory cells addressed by their respective columns and rows, the method comprising:
- testing the RAM by writing and reading values to a sequence of addresses according to a testing algorithm, and comparing read values with expected values;
- upon a mismatch, asserting an error signal and providing column and row addresses of a failed cell producing the mismatch;
- upon a multiple mismatch, asserting a multibad signal and providing a row/column address common to failed cells producing the mismatches;
- updating a failure bit map upon each assertion of the error signal, responsive to the multibad signal, the provided addresses and a current state of the failure bit map to indicate results of the testing thus far, the failure bit map indicating when a row/column must be replaced with a spare row/column due to multiple faulty cells in a particular row/column; and
- allocating spare rows and columns responsive to the state of the failure bit map upon the completion of testing.

22. The method of claim 21, wherein the memory comprises plural segments which are independently repairable.

23. The method of claim 21, wherein testing and repairing are done dynamically upon a command.

24. The method of claim 21, wherein testing and repairing are done dynamically upon providing power to the RAM.

25. The method of claim 21, wherein the RAM is embedded onto a microprocessor chip.

26. The method of claim 22, wherein test and repair hardware are shared among the plural segments.

27. The method of claim 22, wherein the failure bitmap is shared among the plural segments.

28. The method of claim 25, wherein the RAM is an on-chip cache.

29. The method of claim 28, wherein after allocating spare columns and rows, other functions on the chip are tested.

* * * * *